United States Patent
Yao et al.

(10) Patent No.: US 7,585,712 B2
(45) Date of Patent: Sep. 8, 2009

(54) METHODS OF FABRICATING THIN FILM TRANSISTOR ARRAY SUBSTRATE AND FORMING METAL LAYER OF THIN FILM TRANSISTOR ARRAY SUBSTRATE

(75) Inventors: Chi-Wen Yao, Gueishan Township, Taoyuan County (TW); Pei-Hsin Yu, Gueishan Township, Taoyuan County (TW)

(73) Assignee: Au Optronics Corp., Hsinchu (TW)

( * ) Notice: Subject to any disclaimer, the term of this patent is extended or adjusted under 35 U.S.C. 154(b) by 262 days.

(21) Appl. No.: 11/404,425

(22) Filed: Apr. 14, 2006

(65) Prior Publication Data

US 2006/0231407 A1    Oct. 19, 2006

(30) Foreign Application Priority Data

Apr. 15, 2005    (TW) .............................. 94111962 A (51) Int. Cl.
  *H01L 21/00*    (2006.01)
  *H01L 21/84*    (2006.01)
(52) U.S. Cl. ...................... 438/160; 438/149; 438/158; 257/E21.414; 257/E21.635
(58) Field of Classification Search .................. 438/30, 438/149, 763, 158–160, 586, 592–594, 671, 438/687, 151, 154; 257/E21.414, E23.016, 257/E27.1, E29.117, E29.273, E21.026, E21.027, 257/E21.035–E21.037, E21.535, E21.635; 205/123

See application file for complete search history.

(56) References Cited

U.S. PATENT DOCUMENTS

| | | | | | |
|---|---|---|---|---|---|
| 5,130,263 | A | * | 7/1992 | Possin et al. ................. | 438/159 |
| 5,972,193 | A | * | 10/1999 | Chou et al. .................. | 205/122 |
| 5,976,902 | A | * | 11/1999 | Shih ............................ | 438/30 |
| 6,319,741 | B1 | | 11/2001 | Izumi et al. ................... | 438/30 |
| 6,506,675 | B1 | | 1/2003 | Oomiya et al. .............. | 438/677 |
| 6,770,978 | B2 | | 8/2004 | Izumi et al. ................. | 257/762 |
| 6,858,479 | B2 | * | 2/2005 | Kim et al. .................... | 438/158 |
| 2002/0013027 | A1 | * | 1/2002 | Hong et al. ................. | 438/253 |
| 2003/0124781 | A1 | * | 7/2003 | Lee et al. .................... | 438/160 |
| 2004/0203181 | A1 | * | 10/2004 | Shang et al. ................. | 438/30 |
| 2004/0262610 | A1 | * | 12/2004 | Nam ........................... | 257/72 |
| 2009/0072396 | A1 | * | 3/2009 | Wang .......................... | 257/737 |

* cited by examiner

*Primary Examiner*—Matthew C Landau
*Assistant Examiner*—Joseph C Nicely
(74) *Attorney, Agent, or Firm*—J.C. Patents (57) ABSTRACT

A method of fabricating a TFT array substrate and a metal layer thereof is provided. First, a substrate having a first patterned metal layer disposed thereon is provided, wherein the first patterned metal layer is formed by an electroplating method. Then, a gate insulating layer is formed on the substrate, wherein the gate insulating layer covers the first metal layer. Next, a semiconductive layer is formed on the gate insulating layer over the first metal layer. Then, a patterned second metal layer is formed on the semiconductive layer. The first metal layer, the second metal layer and the semiconductive layer constitute a plurality of thin film transistors, a plurality of scanning lines and a plurality of data lines, wherein the scanning lines and the data lines are coupled to the thin film transistors.

10 Claims, 9 Drawing Sheets

METHODS OF FABRICATING THIN FILM TRANSISTOR ARRAY SUBSTRATE AND FORMING METAL LAYER OF THIN FILM TRANSISTOR ARRAY SUBSTRATE

CROSS-REFERENCE TO RELATED APPLICATION

This application claims the priority benefit of Taiwan application serial no. 94111962, Apr. 15, 2005. All disclosure of the Taiwan application is incorporated herein by reference.

BACKGROUND OF THE INVENTION

1. Field of the Invention

The present invention relates to a method of fabricating a thin film transistor (TFT) array substrate and a metal layer thereof, and more particularly, to a method of fabricating a thin film transistor (TFT) array substrate and a metal layer thereof by an electroplating method.

2. Description of the Related Art

Cathode ray tube (CRT) displays have excellent display quality and low costs that they dominate the display market in recent years. In the aspects of the space restriction when several terminals and displays are operated on the same table, environmental protection or power consumption, CRT displays, however, have some problems needed to be solved. Accordingly, thin film transistor liquid crystal displays (TFT LCDs) with high image quality, excellent space-efficiency, low-power consumption and non-radiation have been gradually replacing CRT displays.

For prior art TFT LCDs, aluminum is used as metal lines of the TFT array substrate. Due to the increase of the size of the TFT LCD, the routing of metal lines of TFT array substrates must be increased. As a result, impedance of metal lines is so increased that signal delay of TFT LCDs becomes serious. Therefore, image quality of TFT LCDs degrades.

SUMMARY OF THE INVENTION

Accordingly, the present invention is directed to a method of fabricating a thin film transistor array substrate by an electroplating method. The signal delay the large-size thin film transistor liquid crystal display (TFT LCD) can be suppressed.

The present invention is also directed to a method of forming a metal layer in a TFT array substrate. Accordingly, the choice of the material of the TFT array substrate is more flexible.

According to the objects above and other objects, the present invention provides a method of fabricating a TFT array substrate. The method comprises the following steps. First, a substrate is provided. A first patterned metal layer is formed on the substrate by an electroplating method. A gate insulating layer is then formed over the substrate, and the gate insulating layer covers the first patterned metal layer. Then, a semiconductive layer is formed on the gate insulating layer over the first patterned metal layer. A second patterned metal layer is formed on the semiconductive layer. Wherein, the first patterned metal layer, the second patterned metal layer and the semiconductive layer constitute a plurality of thin film transistors on the substrate and a plurality of scanning lines and a plurality of data lines which are coupled to the thin film transistors.

According to a preferred embodiment of the present invention, the method of forming the first patterned metal layer over the substrate comprises, for example, forming a first patterned electroplating seed layer on the substrate; and electroplating to form the first patterned metal layer by using the first patterned electroplating seed layer as an electrode. The method of patterning the first patterned electroplating seed layer comprises, for example, forming a first conduct material layer on the substrate by a CVD method or a PVD method, performing a photolithographic process and an etching process to the first conductive material layer. Then, an electroplating process is applied to form the first patterned metal layer by using the first patterned electroplating seed layer as an electrode.

In addition, after forming the first patterned electroplating seed layer and before electroplating to form the first patterned metal layer, an insulating material layer is completely formed over the substrate by a chemical vapor deposition (CVD) method, for example. The insulating material layer is then patterned. The patterning method comprises the following steps, for example. First, a photoresist layer is formed on the insulating material layer. A backside exposure process is performed to the photoresist layer on the other surface of the substrate by using the first patterned electroplating seed layer as a mask. The photoresist layer is developed. The insulating material layer is then etched by using the photoresist layer as a mask. The photoresist layer is removed so that the insulating material layer exposes the first patterned electroplating seed layer.

According to a preferred embodiment of the present invention, the method of forming the first patterned electroplating seed layer on the substrate comprises the following steps. First, an insulating material layer is formed on the substrate by a CVD method, for example. A patterned photoresist layer is then formed on the insulating material layer. The insulating material layer is then etched by using the patterned photoresist layer as a mask so that the insulating material layer exposes a portion of the substrate. A first conductive material layer is then completely formed over the substrate by a physical vapor deposition (PVD) method, for example. Finally, the patterned photoresist layer and the first conductive material layer thereon are removed by, for example, a photoresist lift-off method to form the first patterned electroplating seed layer.

According to a preferred embodiment of the present invention, the method of forming the first patterned metal layer over the substrate comprises the following steps. First, a first electroplating seed layer is completely formed on the substrate by a CVD method or a PVD method, for example. A first metal material layer is formed by an electroplating process by using the first electroplating seed layer as an electrode. A mask layer is then formed on the first metal material layer by a CVD method, for example. A photolithographic process and an etching process are then performed to pattern the mask layer. The first metal material layer and the first electroplating seed layer are then etched to form the first patterned metal layer via the patterned mask layer. In addition, the material of the mask layer can be, for example, silicon nitride or silicon oxide.

According to a preferred embodiment of the present invention, the method of forming the semiconductive layer comprises: forming a channel layer; and then forming an ohmic contact layer on the channel layer. Additionally, the material of the first patterned metal layer can be, for example, copper.

According to a preferred embodiment of the present invention, the method of forming the second patterned metal layer over the semiconductive layer comprises the following steps. First, a second conductive material layer is formed on the semiconductive layer by a PVD method or a CVD method, for example. A photolithographic process and an etching process are performed to the second conductive material layer to form the second patterned electroplating seed layer. Then, the second patterned metal layer is formed by an electroplating process by using the second patterned electroplating seed layer as an electrode. In an embodiment, the material of the second metal layer is copper, for example.

The present invention also provides a method of forming a metal layer of a thin film transistor array substrate. The method comprises the following steps. First, a substrate is provided. An electroplating seed layer is formed on the substrate. The metal layer is formed by an electroplating process by using the electroplating seed layer as an electrode.

According to a preferred embodiment of the present invention, the method of forming the electroplating seed layer comprises the following steps. First, a conductive material layer is formed on the substrate, for example. Then, the conductive material layer is patterned to form the electroplating seed layer. After forming the electroplating seed layer and before electroplating to form the metal layer, the method further comprises the following steps. An insulating material layer is completely formed over the substrate by a PVD method or a CVD method. The insulating material layer is then patterned so that the insulating material layer exposes the electroplating seed layer.

In addition, the method of patterning the insulating material layer comprises the following steps, for example. First, a photoresist layer is formed on the insulating material layer. A backside exposure process is performed to the photoresist layer on the other surface of the substrate by using the patterned electroplating seed layer as a mask. The photoresist layer is developed. The insulating material layer is then etched by using the photoresist layer as a mask. The photoresist layer is then removed.

According to a preferred embodiment of the present invention, the method of forming the patterned electroplating seed layer on the substrate comprises the following steps. First, an insulating material layer is formed on the substrate by a CVD method, for example. A patterned photoresist layer is then formed on the insulating material layer. The insulating material layer is then etched by using the patterned photoresist layer as a mask so that the insulating material layer exposes a portion of the substrate. A conductive material layer is then completely formed over the substrate by a physical vapor deposition (PVD) method, for example. Finally, the patterned photoresist layer and the conductive material layer thereon are removed by, for example, a photoresist lift-off method to form the patterned electroplating seed layer.

According to a preferred embodiment of the present invention, after forming the electroplating seed layer completely on the substrate and electroplating to form the metal layer, the method further comprises performing a photolithographic process and an etching process to the metal layer and the electroplating seed layer. In addition, the method of forming the electroplating seed layer on the substrate can be, for example, a physical vapor deposition method or a chemical vapor deposition method.

According to a preferred embodiment of the present invention, the material of the metal layer can be, for example, copper.

Accordingly, the electroplating method is applied in the process of fabricating the TFT array substrate and the metal layer thereof in the present invention. Different from the prior art technique, the TFT array substrate formed by the electroplating method relaxes the choice of the material of the metal layer of the TFT array substrate. While the TFT array substrate is fabricated, copper or other low-resistance metal material can be used to improve electrical performances of TFTs, scanning lines and data lines on the substrate. Accordingly, signal delay of the large-size TFT LCD can be reduced. The image quality of the LCD is thus enhanced.

The above and other features of the present invention will be better understood from the following detailed description of the preferred embodiments of the invention that is provided in communication with the accompanying drawings.

DESCRIPTION OF SOME EMBODIMENTS

Figure 1:
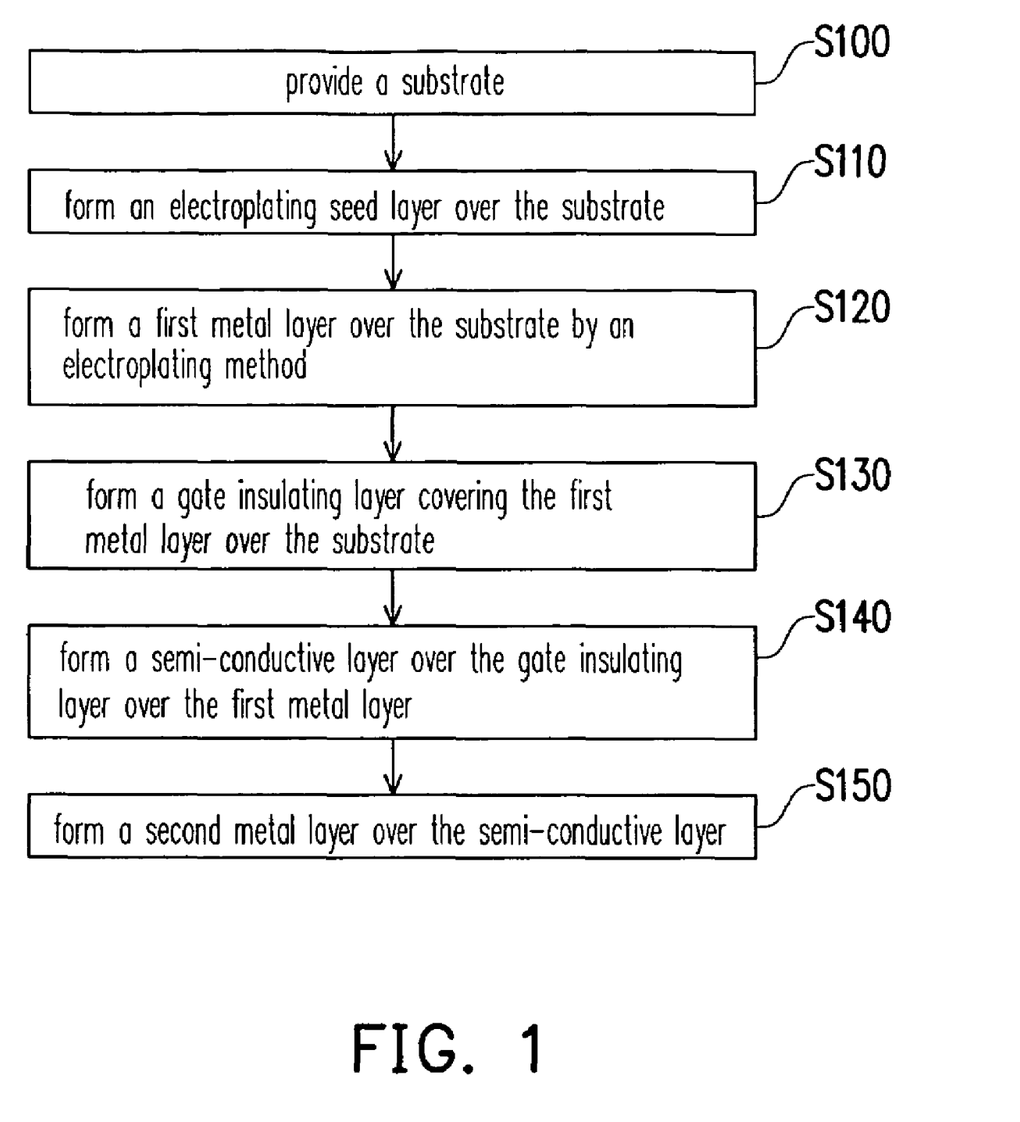
FIG. 1 is a flowchart showing a method of fabricating a thin film transistor (TFT) array substrate according to a preferred embodiment of the present invention.

FIG. 1 is a flowchart showing a method of fabricating a thin film transistor (TFT) array substrate according to a preferred embodiment of the present invention. Referring to FIG. 1, the method of fabricating a TFT array substrate comprises the following steps. First, a substrate is provided in the step S100. The substrate can be, for example, a transparent substrate. In order to form an electrode on the substrate for the subsequent electroplating method, a metal layer is deposited over the substrate as an electroplating seed layer by a physical vapor deposition (PVD) method or a chemical vapor deposition (CVD) method (step S110). By using the electroplating seed layer as an electrode, the first metal layer is formed over the substrate by the electroplating method (step S120). In step S130, a gate insulating layer is formed over the substrate covering the first metal layer by a CVD method. Then, a semiconductive layer is formed on the gate insulating layer over the first metal layer (step S140). Finally, the second metal layer is formed on the semiconductive layer (step S150).

In order to describe the features of the present invention, following are descriptions of different embodiments for fabricating a TFT array substrate.

First Embodiment

Figure 2A:
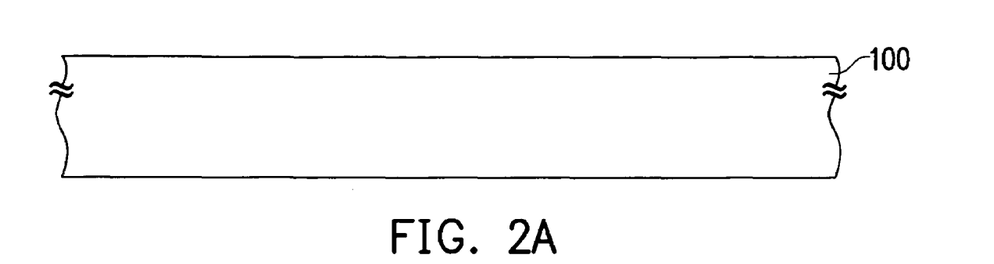
FIGS. 2A-2H are schematic drawings showing a method of fabricating a TFT array substrate according to a first embodiment of the present invention.
Figure 2B:
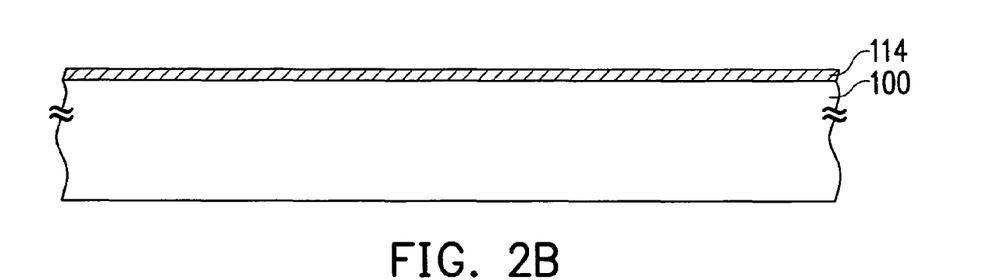
Figure 2C:
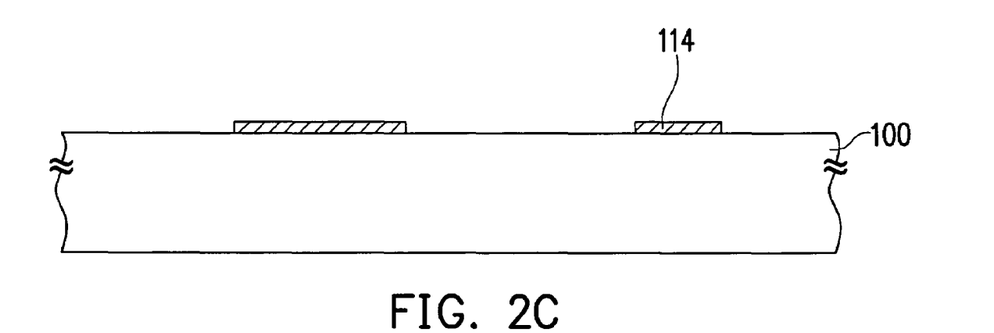
Figure 2D:
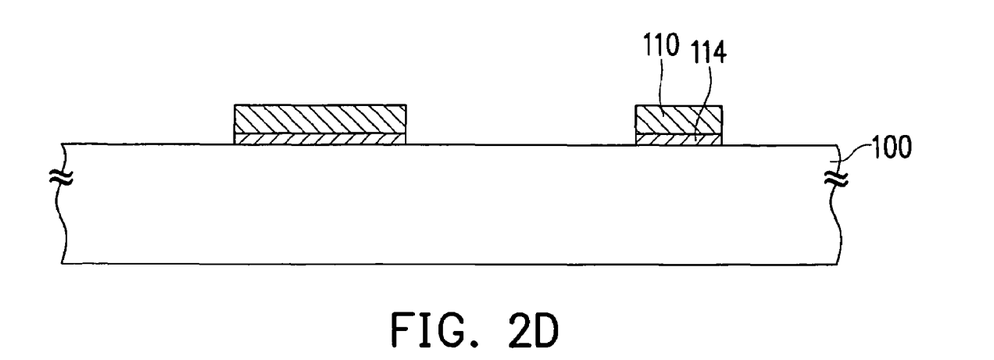
Figure 2E:
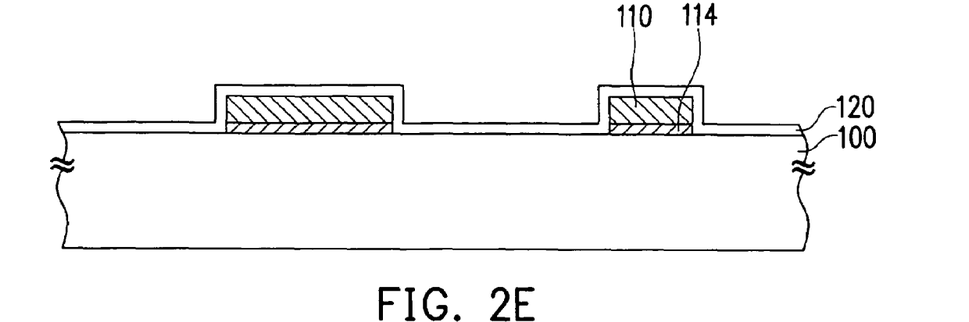
Figure 2F:
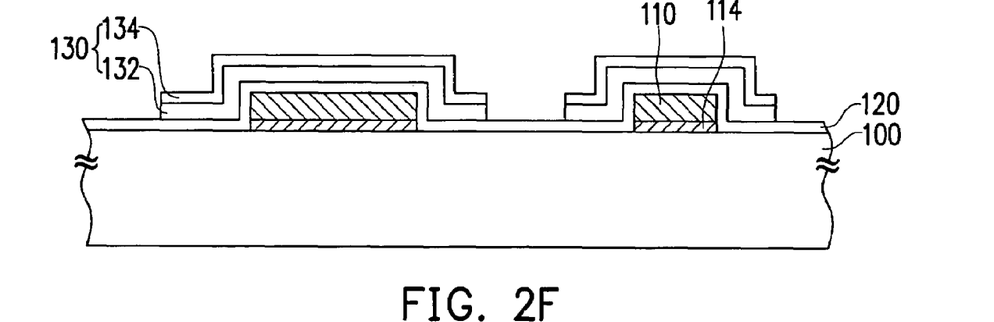
Figure 2G:
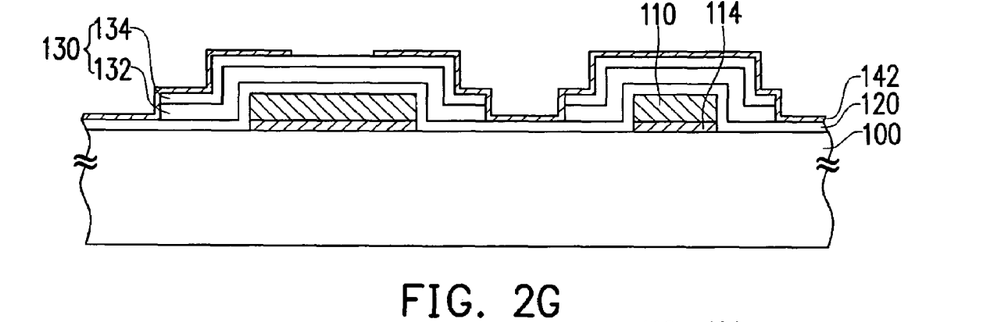
Figure 2H:
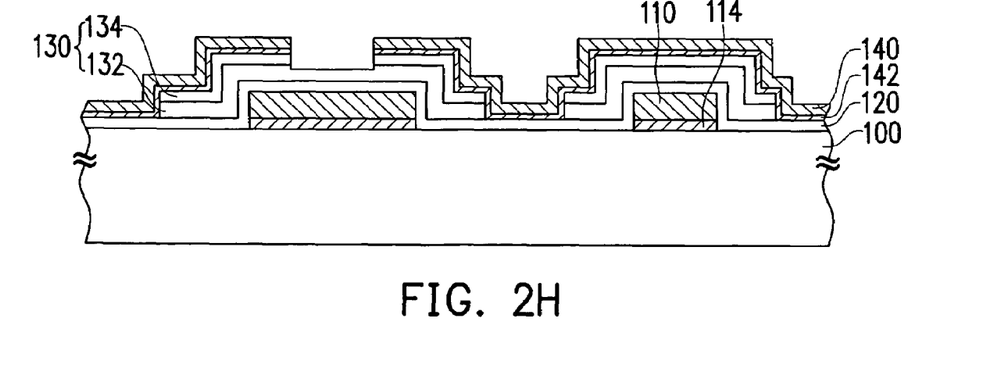

FIGS. 2A-2G are schematic drawings showing a method of fabricating a TFT array substrate according to a first embodiment of the present invention. Referring to FIG. 2A, a substrate 100 is provided. The substrate 100 can be, for example, a transparent substrate. Referring to FIG. 2B, an electroplating seed layer 114 is then formed on the substrate 100. Referring to FIG. 2C, a photolithographic process and an etching process are performed to pattern the electroplating seed layer 114. Then, referring to FIG. 2D, a patterned metal layer 110 is formed over the substrate 100 by an electroplating method and by using the patterned electroplating seed layer 114 as an electrode. Wherein, the material of the metal layer 110 can be, for example, copper. Referring to FIG. 2E, a gate insulating layer 120 is formed over the substrate 100 by a CVD method, for example. The material of the gate insulating layer 120 can be, for example, silicon nitride or silicon oxide. The gate insulating layer 120 also covers the metal layer 110. Referring to FIG. 2F, a channel layer 132 is then formed on the gate insulating layer 120 over the patterned metal layer 110. An ohmic contact layer 134 is formed on the channel layer 132. Wherein, the channel layer 132 and the ohmic contact layer 134 constitute a semiconductive layer 130. In addition, the material of the channel layer 132 can be, for example, amorphous silicon. The material of the ohmic contact layer 134 can be, for example, n+ doped amorphous silicon. In another preferred embodiment of the present invention, the material of the channel layer 132 can be, for example, polysilicon. Referring to FIG. 2G, a patterned electroplating seed layer 142 is formed on the semiconductive layer 130. Referring to FIG. 2H, a metal layer 140 is then formed on the electroplating seed layer 142 by an electroplating method.

After the processes above, the metal layers 110 and 140, and the semiconductive layer 130 over the substrate 100 constitute a plurality of TFTs, a plurality of scanning lines and a plurality of data lines so as to form a TFT array substrate.

Second Embodiment

Figure 3A:
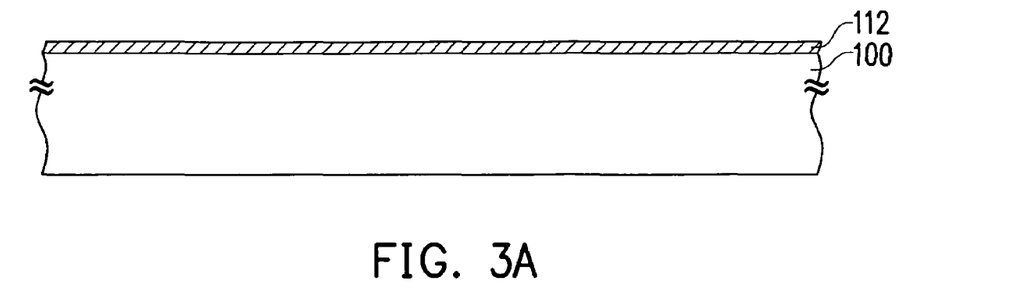
FIGS. 3A-3G are schematic drawings showing a method of fabricating a TFT array substrate according to a second embodiment of the present invention.
Figure 3B:
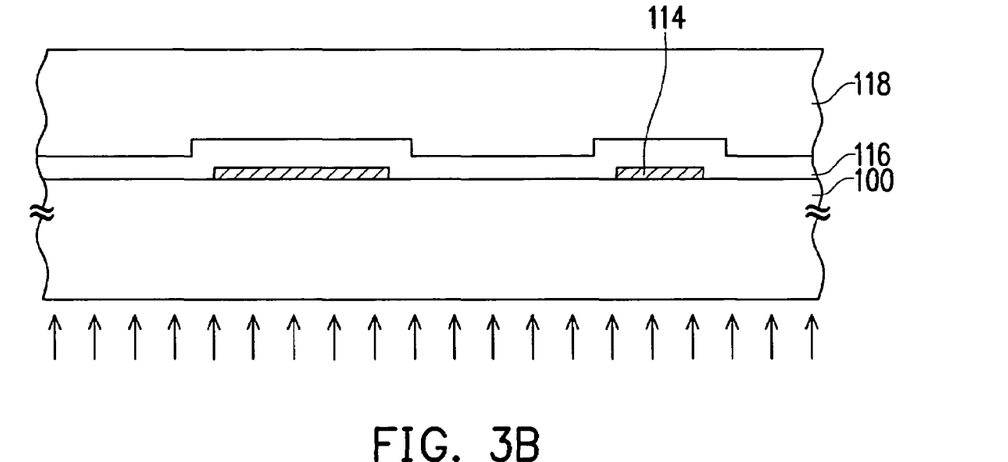
Figure 3C:
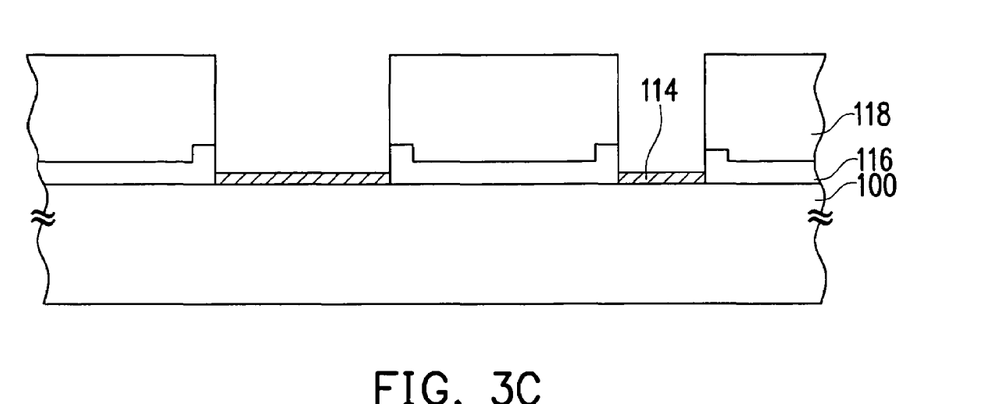
Figure 3D:
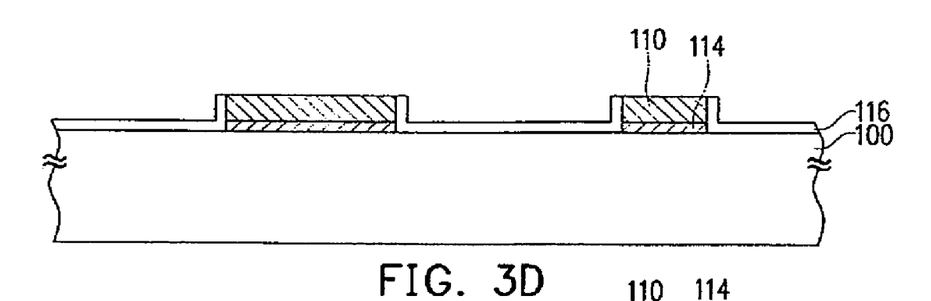

FIGS. 3A-3G are schematic drawings showing a method of fabricating a TFT array substrate according to a second embodiment of the present invention. Referring to FIG. 3A, a conductive material layer 112 is completely formed on the substrate 100 by a PVD method or a CVD method, for example. Referring to FIG. 3B, a photolithographic process and an etching process are performed to pattern the conductive material layer 112. The patterned conductive material layer 112 is the electroplating seed layer 114. Then, an insulating material layer 116 is formed over the substrate 100 by a CVD method, for example. The material of the insulating material layer 116 can be, for example, silicon nitride or silicon oxide. A photoresist layer 118 is then coated on the insulating material layer 116. A backside exposure process is performed to the photoresist layer 118 on the other surface of the substrate 100 by using the electroplating seed layer 114 as a mask. Referring to FIG. 3C, the photoresist layer 118 is developed. The insulating material layer 116 is then etched by using the photoresist layer 118 as a mask, exposing the electroplating seed layer 114. Referring to FIG. 3D, the photoresist layer 118 is removed. The metal layer 110 is formed on the electroplating seed layer 114 by the electroplating method.

Note that the difference between this embodiment and the first embodiment is that after forming the electroplating seed layer 114, the insulating material layer 116 is formed over the substrate 100 covering the electroplating seed layer 114 in this embodiment. Then, the photolithographic process and the etching process are performed to the insulating material layer 116 to expose the electroplating seed layer 114. The metal layer 110 is then formed by the electroplating method. In the first embodiment, the patterned conductive material layer 112 serves as the electroplating seed layer 114. The metal layer 110 is then formed on the electroplating seed layer 114 by the electroplating method without depositing the insulating material layer 116 over the substrate 110.

Figure 3E:
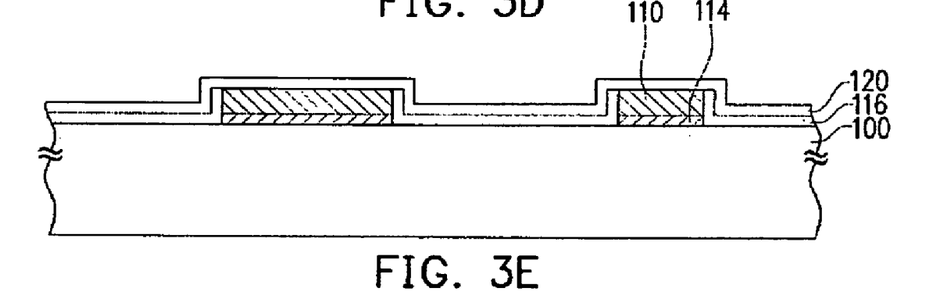
Figure 3F:
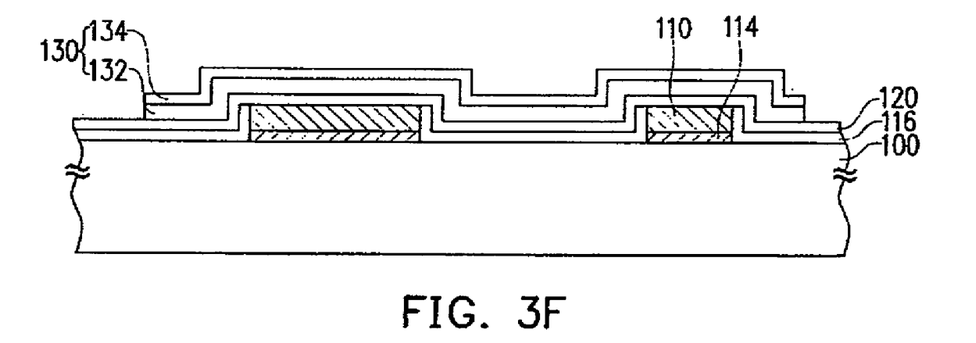
Figure 3G:
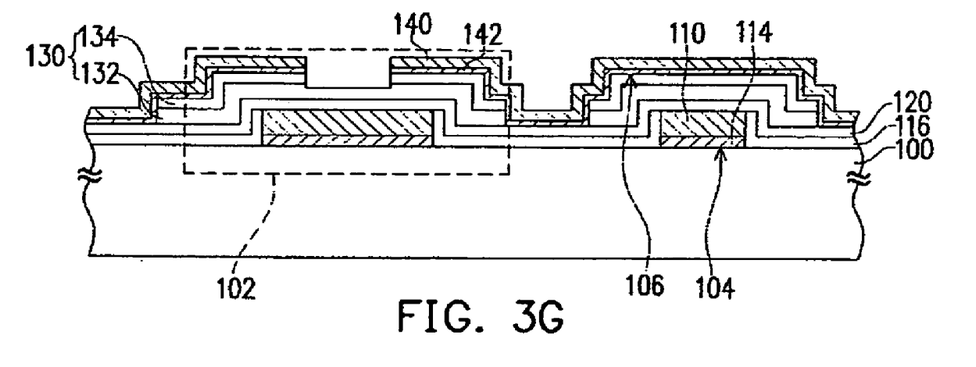

Referring to FIG. 3E, the gate insulating layer 120 is then formed over the substrate 100 by a CVD method, for example. The material of the gate insulating layer 120 can be, for example, silicon nitride or silicon oxide. The gate insulating layer 120 also covers the metal layer 110 and the insulating material layer 116. Referring to FIG. 3F, the channel layer 132 is then formed on the gate insulating layer 120 over the patterned metal layer 110. The ohmic contact layer 134 is formed on the channel layer 132. Wherein, the channel layer 132 and the ohmic contact layer 134 constitute the semiconductive layer 130. In addition, the material of the channel layer 132 can be, for example, amorphous silicon. The material of the ohmic contact layer 134 can be, for example, n+ doped amorphous silicon. In another preferred embodiment of the present invention, the material of the channel layer 132 can be, for example, polysilicon. Referring to FIG. 3G, the patterned electroplating seed layer 142 is formed on the semiconductive layer 130. A metal layer 140 is then formed on the electroplating seed layer 142 by an electroplating method.

After the processes above, the metal layers 110 and 140, and the semi-conductive layer 130 over the substrate 100 constitute a plurality of TFTs, 102, a plurality of scan lines 104 and a plurality of data lines 106 so as to form a TFT array substrate.

Third Embodiment

Figure 4A:
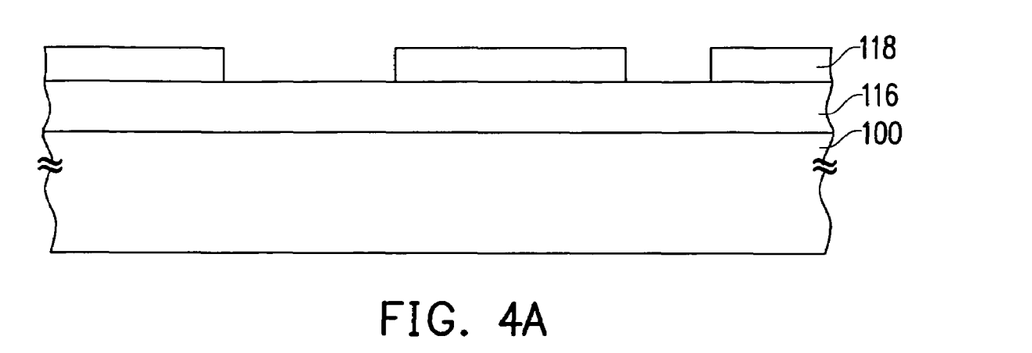
FIGS. 4A-4G are schematic drawings showing a method of fabricating a TFT array substrate according to a third embodiment of the present invention.
Figure 4B:
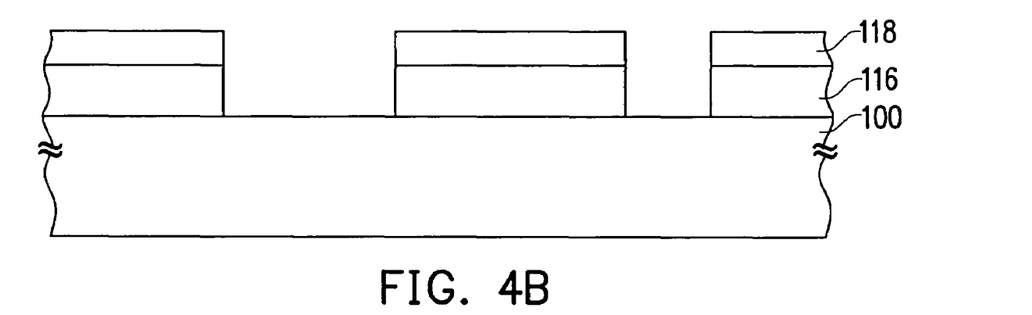
Figure 4C:
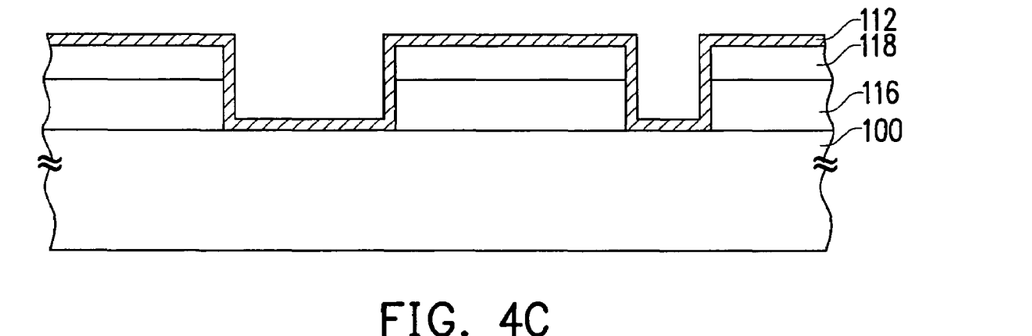
Figure 4D:
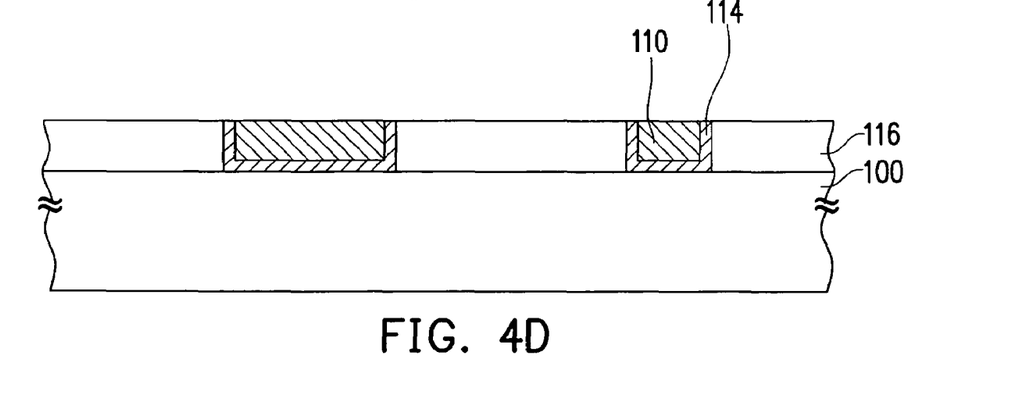

FIGS. 4A-4G are schematic drawings showing a method of fabricating a TFT array substrate according to a third embodiment of the present invention. Referring to FIG. 4A, the insulating material layer 116 is formed on the substrate 100 by a CVD method, for example. A photoresist layer 118 is then formed on the insulating material layer 116. A photolithographic process and an etching process are performed to pattern the photoresist layer 118. Referring to FIG. 4B, the insulating material layer 116 is then etched by using the photoresist layer 118 as a mask, exposing a portion of the substrate 100. Referring to FIG. 4C, the conductive material layer 112 is completely formed over the substrate 100 by a PVD method, for example. The photoresist layer 118 and the conductive material layer 112 thereon are then removed by a photoresist lift-off method, for example. The remaining conductive material layer 112 is an electroplating seed layer 114. Referring to FIG. 4D, the metal layer 110 is then deposited on the electroplating seed layer 114 by the electroplating method.

Figure 4E:
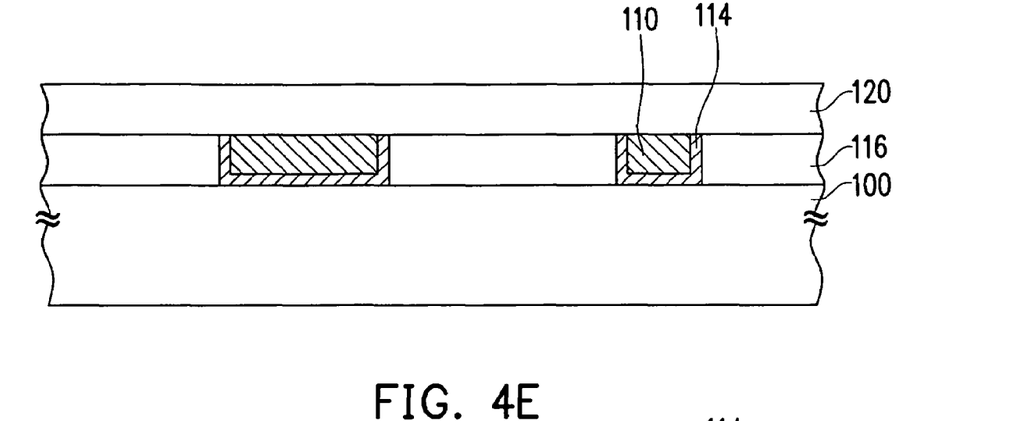
Figure 4F:
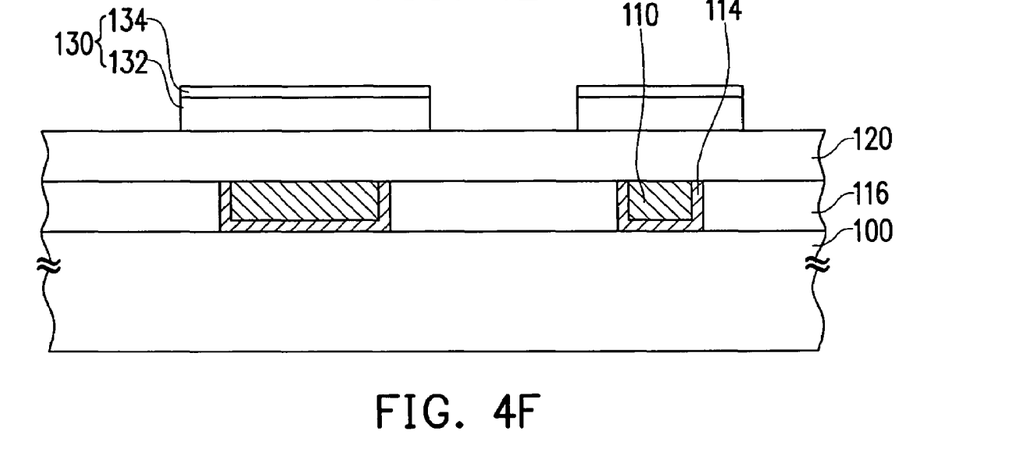
Figure 4G:
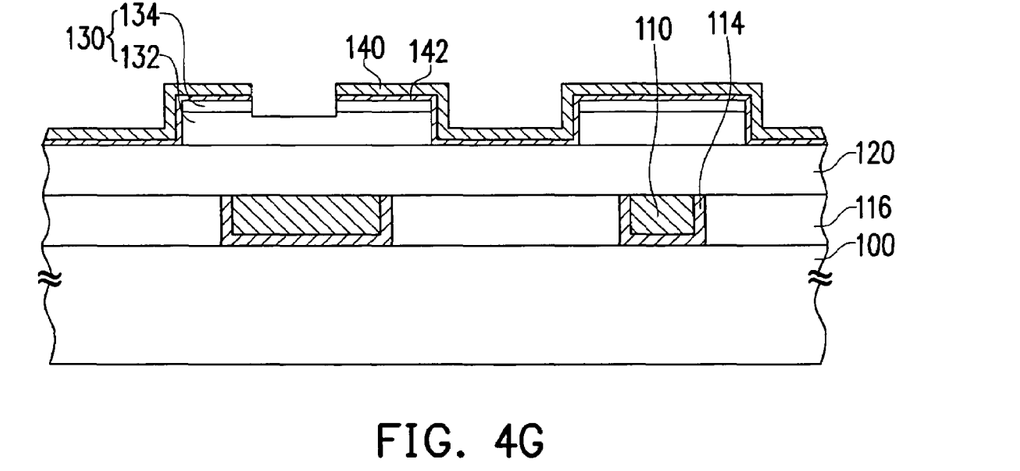

Referring to FIG. 4E, the gate insulating layer 120 is then formed over the substrate 100 by a CVD method, for example. The material of the gate insulating layer 120 can be, for example, silicon nitride or silicon oxide. The gate insulating layer 120 also covers the metal layer 110 and the insulating material layer 116. Referring to FIG. 4F, the channel layer 132 is then formed on the gate insulating layer 120 over the patterned metal layer 110. The ohmic contact layer 134 is formed on the channel layer 132. Wherein, the channel layer 132 and the ohmic contact layer 134 constitute the semiconductive layer 130. In addition, the material of the channel layer 132 can be, for example, amorphous silicon. The material of the ohmic contact layer 134 can be, for example, n+ doped amorphous silicon. In another preferred embodiment of the present invention, the material of the channel layer 132 can be, for example, polysilicon. Referring to FIG. 4G, the patterned electroplating seed layer 142 is formed on the semiconductive layer 130. The metal layer 140 is then formed on the electroplating seed layer 142 by an electroplating method.

After the processes above, the metal layers 110 and 140, and the semiconductive layer 130 over the substrate 100 constitute a plurality of TFTs, a plurality of scanning lines and a plurality of data lines so as to form a TFT array substrate.

Fourth Embodiment

Figure 5A:
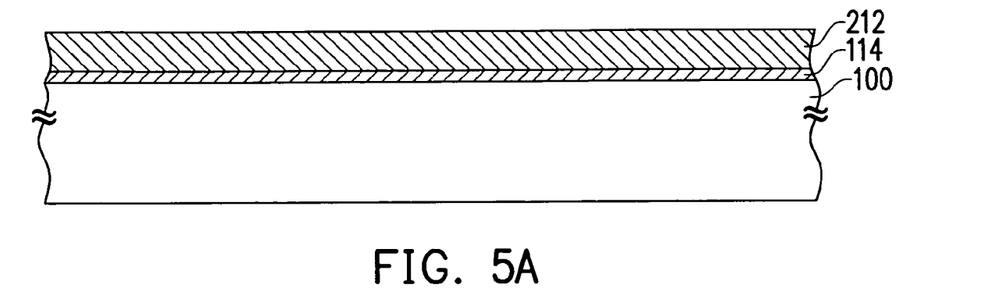
FIGS. 5A-5G are schematic drawings showing a method of fabricating a TFT array substrate according to a fourth embodiment of the present invention.
Figure 5B:
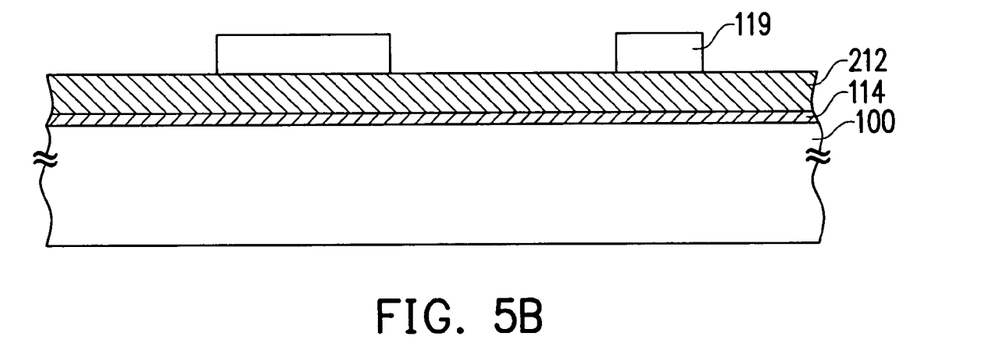
Figure 5C:
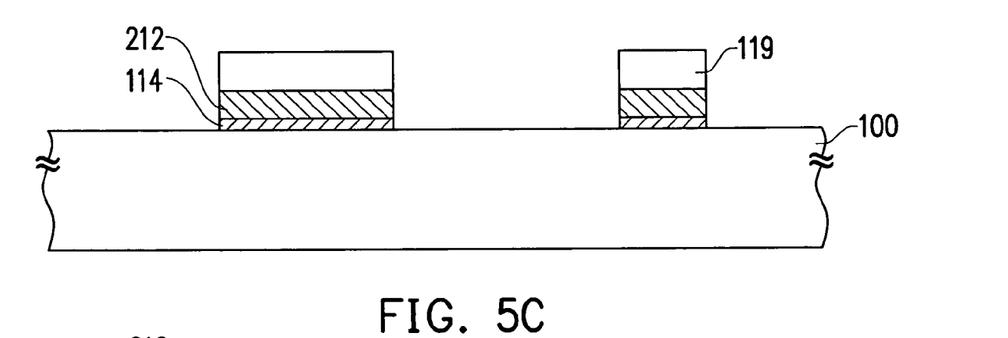
Figure 5D:
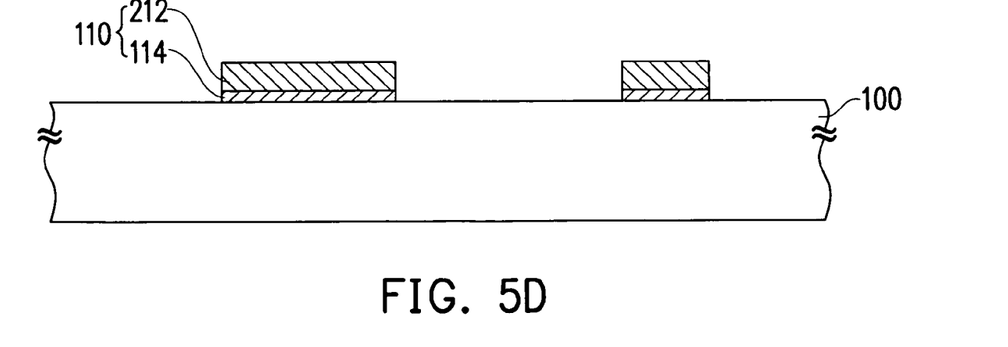

FIGS. 5A-5G are schematic drawings showing a method of fabricating a TFT array substrate according to a fourth embodiment of the present invention. Referring to FIG. 5A, the electroplating seed layer 114 is completely formed on the substrate 100 by a PVD method or a CVD method, for example. The metal material layer 212 is then formed by the electroplating method and by using the electroplating seed layer as an electrode. Referring to FIG. 5B, a mask layer 119 is then deposited on the metal material layer 212 by a CVD method, for example. The material of the mask layer 119 can be, for example, silicon oxide or silicon nitride. A photolithographic process and an etching process are performed to pattern the mask layer 119. Referring to FIG. 5C, the metal material layer 212 and the electroplating seed layer 114 are etched via the mask layer 119. Then, the mask layer 119 is removed. Finally, referring to FIG. 5D, the remaining metal material layer 212 and electroplating seed layer 114 constitute the metal layer 110.

Figure 5E:
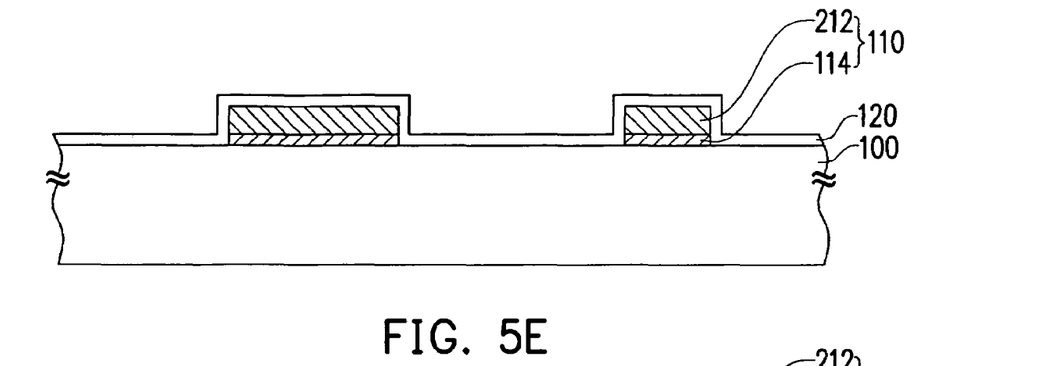
Figure 5F:
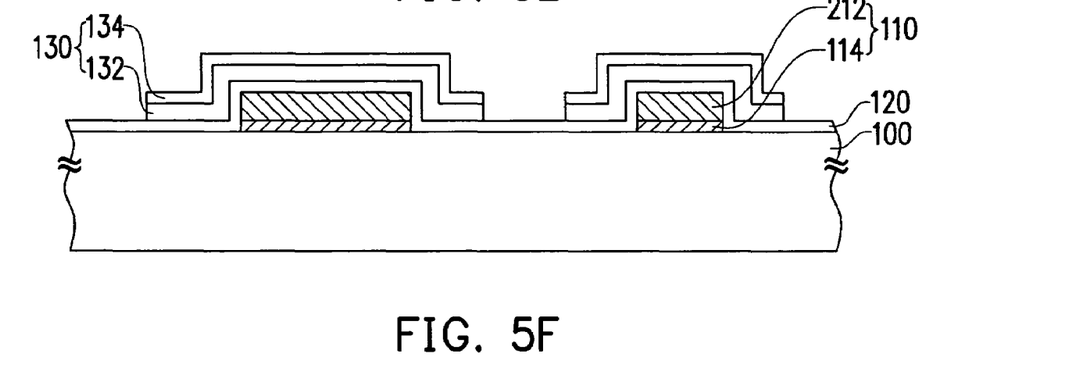
Figure 5G:
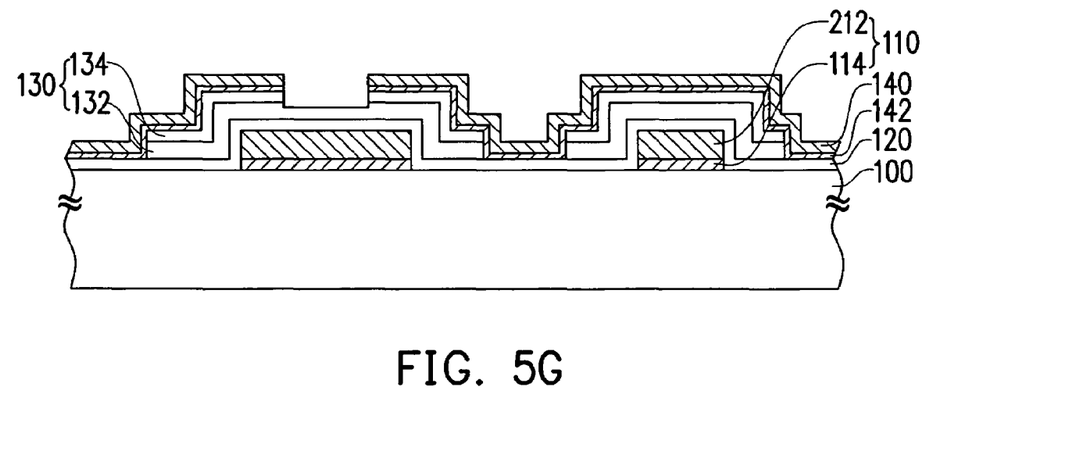

Referring to FIG. 5E, the gate insulating layer 120 is then formed over the substrate 100 by a CVD method, for example. The material of the gate insulating layer 120 can be, for example, silicon nitride or silicon oxide. The gate insulating layer 120 also covers the metal layer 110 and the insulating material layer 116. Referring to FIG. 5F, the channel layer 132 is then formed on the gate insulating layer 120 over the patterned metal layer 110. The ohmic contact layer 134 is formed on the channel layer 132. Wherein, the channel layer 132 and the ohmic contact layer 134 constitute the semiconductive layer 130. In addition, the material of the channel layer 132 can be, for example, amorphous silicon. The material of the ohmic contact layer 134 can be, for example, n+ doped amorphous silicon. In another preferred embodiment of the present invention, the material of the channel layer 132 can be, for example, polysilicon. Referring to FIG. 5G, the patterned electroplating seed layer 142 is formed on the semiconductive layer 130. The metal layer 140 is then formed on the electroplating seed layer 142 by an electroplating method.

After the processes above, the metal layers 110 and 140, and the semiconductive layer 130 over the substrate 100 constitute a plurality of TFTs, a plurality of scanning lines and a plurality of data lines so as to form a TFT array substrate.

According to the present invention, the electroplating method is applied in the method of fabricating a TFT array substrate and the metal layer thereof. The electroplating method has a high metal deposition rate and low manufacturing costs. Different from prior art technique, the present invention uses the electroplating method to fabricate a TFT array substrate and relaxes the choice of material of the metal layer of the TFT array substrate. While the TFT array substrate is fabricated, copper or other low-resistance metal material can be used to improve electrical performances of TFTs, scanning lines and data lines on the substrate. Accordingly, signal delay of the large-size TFT LCD can be reduced. The image quality of the LCD is thus enhanced.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method of fabricating a thin film transistor array substrate, comprising:
   providing a substrate;
   forming a first patterned electroplating seed layer on the substrate;
   forming an insulating material layer completely over the substrate so as to cover the first patterned electroplating seed layer;
   forming a photoresist layer on the insulating material layer;
   performing a backside exposure process to the photoresist layer on a backside surface of the substrate by using the first patterned electroplating seed layer as a first mask;
   developing the photoresist layer to form an opening in the photoresist layer and above the first patterned electroplating seed layer so that the opening exposes the insulating material layer above the first patterned electroplating seed layer;
   etching the insulating material layer by using the photoresist layer as a second mask so that the insulating material layer exposes the first patterned electroplating seed layer;
   forming first patterned metal layer over the substrate by an electroplating method;
   removing the photoresist layer;
   forming a gate insulating layer over the substrate, the gate insulating layer covering the first patterned metal layer;
   forming a semiconductive layer on the gate insulating layer over the first patterned metal layer; and
   forming a second patterned metal layer over the semiconductive layer, wherein the first patterned metal layer, the second patterned metal layer and the semiconductive layer constitute a plurality of thin film transistors on the substrate, a plurality of scanning lines and a plurality of data lines, wherein the scanning lines and the data lines are coupled to the thin film transistors.

2. The method of fabricating a thin film transistor array substrate of claim 1, wherein a method of forming the first patterned metal layer over the substrate comprises electroplating to form the first patterned metal layer by using the first patterned electroplating seed layer as an electrode.

3. The method of fabricating a thin film transistor array substrate of claim 1, wherein a method of forming the first patterned electroplating seed layer on the substrate comprises:
   forming a first conductive material layer on the substrate; and
   patterning the first conductive material layer to form the first patterned electroplating seed layer.

4. The method of fabricating a thin film transistor arrays substrate of claim 1, wherein a method of forming the second patterned metal layer over the semiconductive layer comprises:
   forming a second patterned electroplating seed layer on the semiconductive layer; and
   electroplating to form the second patterned metal layer by using the second patterned electroplating seed layer as an electrode.

5. The method of fabricating a thin film transistor array substrate of claim 4, wherein a method of forming the second patterned electroplating seed layer on the semiconductive layer comprises:
   forming a second conductive material layer on the semiconductive layer; and patterning the second conductive material layer to form the second patterned electroplating seed layer.

6. The method of fabricating a thin film transistor array substrate of claim 1, wherein a method of forming the semiconductive layer comprises:

forming a channel layer; and forming an ohmic contact layer on the channel layer.

7. The method of fabricating a thin film transistor array substrate of claim 1, wherein the photoresist layer is a negative photoresist layer.

8. A method of forming a metal layer of a thin film transistor array substrate, comprising:

providing a substrate;

forming an electroplating seed layer on the substrate;

forming an insulating material layer completely over the substrate so as to cover the electroplating seed layer;

forming a photoresist layer on the insulating material layer;

performing a backside exposure process to the photoresist layer on backside surface of the substrate by using the electroplating seed layer as a first mask;

developing the photoresist layer to form an opening in the photoresist layer and above the electroplating seed layer so that the opening exposes the insulating material layer above the electroplating seed layer;

etching the insulating material layer by using the photoresist layer as a second mask so that the insulating material layer exposes the electroplating seed layer;

electroplating to form a metal layer by using the electroplating seed layer as an electrode; and removing the photoresist layer.

9. The method of forming a metal layer of a thin film transistor array substrate of claim 8, wherein a method of forming the electroplating seed layer comprises:

forming a conductive material layer on the substrate; and patterning the conductive material layer to form the electroplating seed layer.

10. The method of forming a metal layer of a thin film transistor array substrate of claim 8, wherein the photoresist layer is a negative photoresist layer.

* * * * *